(12) United States Patent
Cho et al.

(10) Patent No.: US 6,432,735 B1
(45) Date of Patent: Aug. 13, 2002

(54) HIGH POWER SINGLE MODE LASER AND METHOD OF FABRICATION

(75) Inventors: Si Hyung Cho, Silver Spring, MD (US); William C. Dautremont-Smith, Orefield, PA (US); Sun-Yuan Huang, Fremont, CA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/602,931

(22) Filed: Jun. 23, 2000

(51) Int. Cl.[7] .............................................. H01L 29/06
(52) U.S. Cl. ...................................................... 438/31
(58) Field of Search ............................... 438/52, 31, 46, 438/47

(56) References Cited

U.S. PATENT DOCUMENTS 5,583,881 A * 12/1996 Uchida et al. ................ 372/49

OTHER PUBLICATIONS

Growth and Characterization of High Yield, Reliable High Power, High Speed, InP/InGaAsP Capped Mesa Buried Heterostructure Distributed Feedback (CMBH–DFB) Lasers, Zilko, et al, IEEE Journal of Quantum Electronics, vol. 25, No. 10, Oct. 1989.

* cited by examiner

*Primary Examiner*—David Nelms
*Assistant Examiner*—Quoc Hoang

(57) ABSTRACT

A semiconductor laser having a single transverse mode operation. Optical power higher than that generated by conventional pump lasers is achieved by widening the gain medium without inducing the second transverse mode. This is accomplished by providing a small refractive index difference between active and blocking regions of the laser. The refractive index difference between the laser active region material and the laser blocking region material at the fundamental frequency is less than about 0.029.

16 Claims, 4 Drawing Sheets

HIGH POWER SINGLE MODE LASER AND METHOD OF FABRICATION

FIELD OF THE INVENTION

The invention relates to semiconductor lasers, and more particularly, to high power, single mode semiconductor lasers.

BACKGROUND OF THE INVENTION

Semiconductor pump lasers are widely used in fiber amplification communication systems such as Dense Wavelength Division Multiplexing Systems (DWDMS). DWDMS typically carry 80 or more channels. The number of channels carried by a communication system is directly proportional to the pump power needed to operate the system. An 80 channel system may require for example, two 980 nm pump lasers and four 1480 nm pump lasers, each operated at 150 mW. By increasing laser pump power, fewer lasers are needed to accommodate all channels, likely reducing system cost and complexity.

Laser pump power may be increased by increasing semiconductor chip length. As chip length increases, gain volume increases thereby increasing power. However, increased chip length may cause internal power loss of the laser's optical waveguide.

The laser pump power may also be increased by widening the active region of the laser. Resistance decreases as the active region width increases, thereby increasing power. However, increased active region width may result in inclusion of an unwanted second transverse mode. Such multi-longitudinal laser mode spectra may adversely affect the performance of fiber optic communication systems, and are therefore undesirable for such applications.

Master Oscillator Power Amplifier (MOPA) structures have also been used to increase power. MOPAs comprise an optical master oscillator followed by a power amplifier stage. MOPA use may not be desirable because MOPA fabrication is complex and coupling light from a MOPA structure into a single mode fiber is difficult.

Therefore, a need exists for a high power, single mode semiconductor laser that is relatively simple to manufacture and is compatible with a fiber amplification communication system.

SUMMARY OF THE INVENTION

The invention provides a high power semiconductor laser having a single transverse mode operation. In an exemplary embodiment optical power higher than that generated by conventional pump lasers is achieved by widening the gain medium without inducing the second transverse mode. This is accomplished by providing a small refractive index difference between active and blocking regions of the laser. Illustratively, the refractive index difference between the laser active region material and the laser blocking region material at the fundamental frequency is less than about 0.029. An exemplary refractive index range is about 0.020 to 0.025.

DETAILED DESCRIPTION OF THE INVENTION

Figure 1:
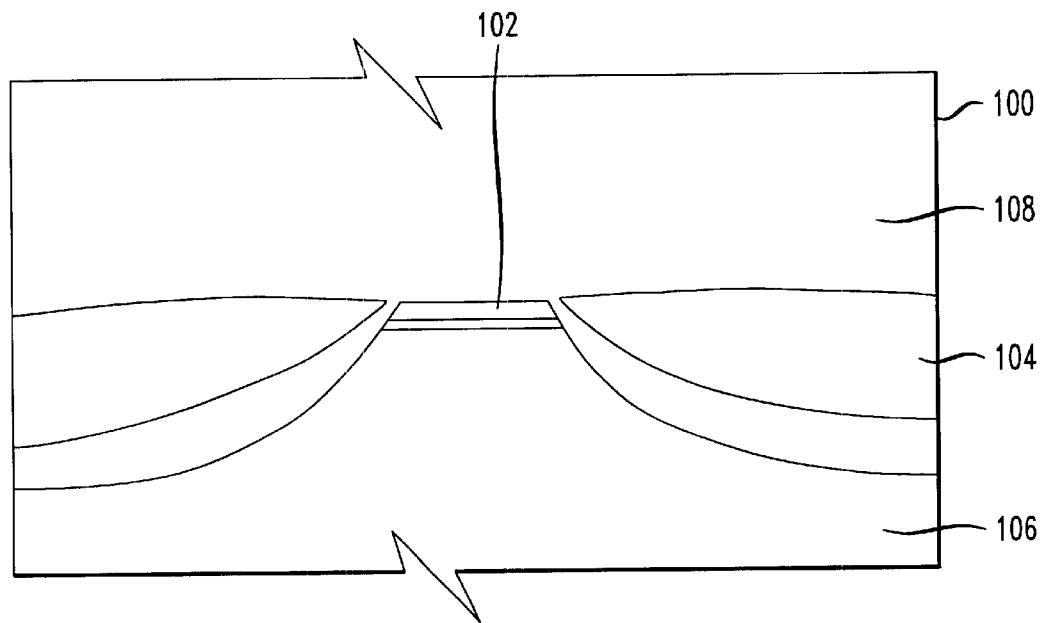
FIG. 1 depicts a buried-heterostructure laser.

FIG. 1 depicts a heterostructure laser 100. The active region 102 has blocking 160 regions 104 adjacent thereto and extending laterally from opposite sides of active region 102. Blocking regions 104 may consist of a plurality of layers. The refractive index of the active region material differs from that of the blocking region material providing lateral optical confinement. The difference in refractive indices also provides the current blocking capability useful in limiting the laser drive current from leaking through the non-active region. In conventional heterostructure lasers the effective refractive index difference between the blocking region and the fundamental transverse mode of the active region is about 0.03. This provides a single transverse mode for a 1480 nm pump laser with an active region stripe width of 2.4 μcm.

When the stripe width is increased an unwanted second transverse mode may arise. For example, when the stripe width is increased to 10 μm, the transverse electrical (TE) mode with lowest loss is the $TE_{06}$. It is desirable to provide a laser structure having the fundamental mode, $TE_{00}$, with lowest loss for a stripe width of approximately 10 μm. A 10 μm stripe width may be easily coupled to optical fibers having that width which are readily available.

To achieve a single transverse mode with a stripe width of 10 μm, the blocking regions and active region may be comprised of like-materials. For example, InGaAsP may be used both as blocking and active region materials. As used herein "like-materials" means materials comprised of the same elements but differing in the ratio of elements. Reference to a particular material includes that material in a pure form or having impurities or dopants. The use of like-materials reduces the refractive index difference between the active and blocking regions such that the $TE_{00}$ mode may spread over a larger width as compared, for example, to a heterojunction comprising conventional InP blocking regions and an InGaAsP active region.

Advantageously, use of like-materials for the blocking regions also avoids significant lattice mismatch at the heterojunction of the active and blocking regions. Lattice mismatch between materials making up the heterojunction may result in lattice defects. These defects may reduce radiative recombination efficiency thereby reducing the device life expectancy. Thus, use of like-materials for the active and blocking regions may improve device quality and performance.

Figure 2A:
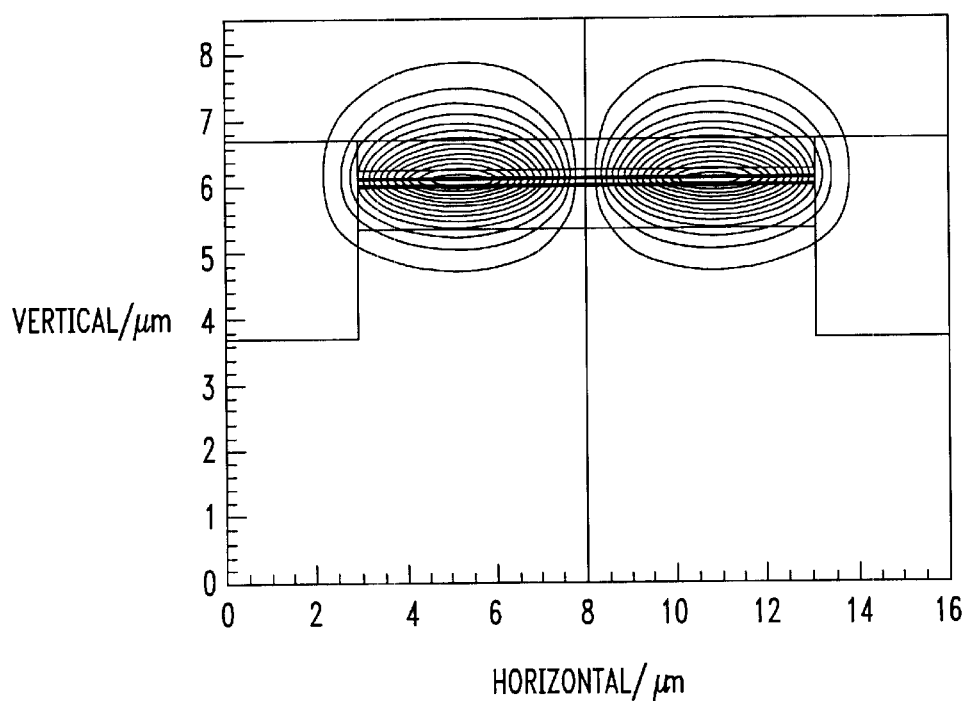
FIGS. 2A–C show transverse electrical modes with lowest loss for different blocking material refractive indices.
Figure 2B:
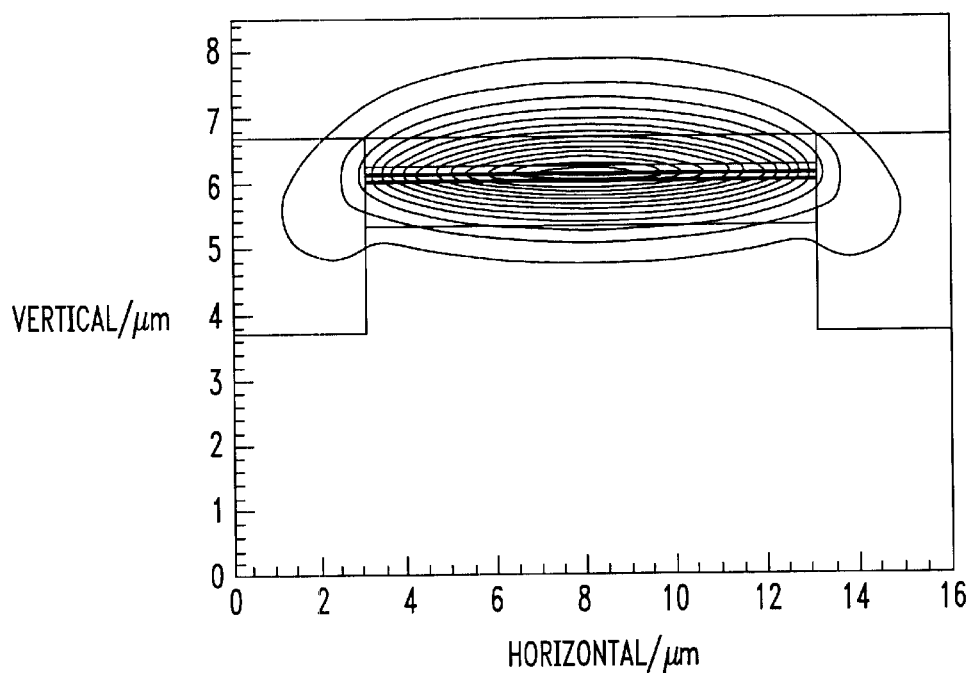
Figure 2C:
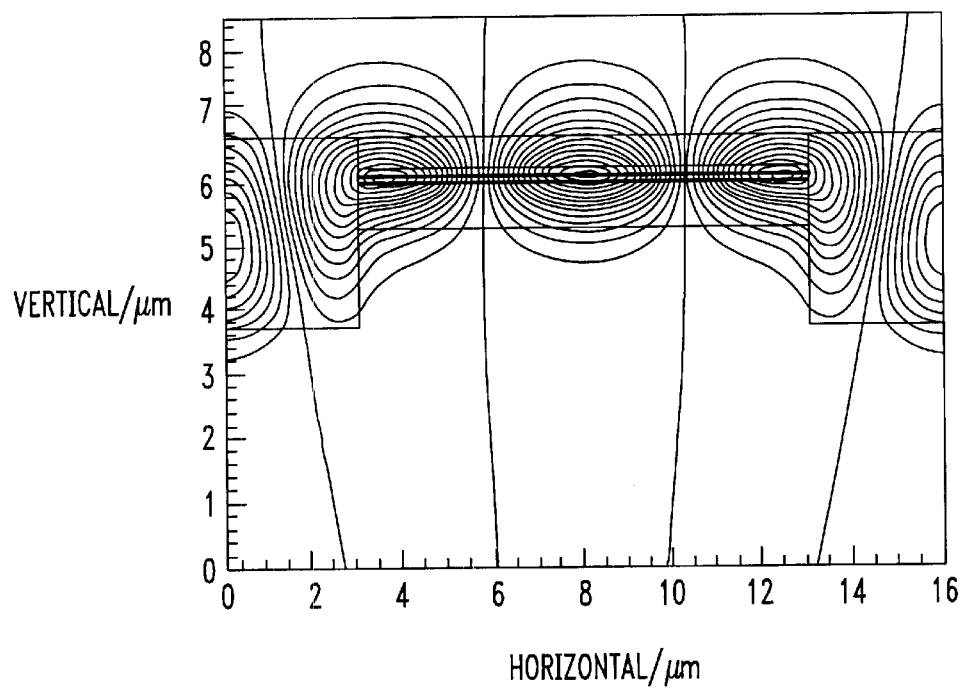

To confirm the ability of the $TE_{OO}$ mode to spread over the larger width when the refractive index difference is decreased, simulations were performed for different block region compositions. FIGS. 2A–C provide TE modes with lowest loss for different blocking material refractive indices. The TE modes depicted in FIGS. 2A–2C are produced by blocking materials having refractive indices of 3.160, 3.180, and 3.190, respectively. As shown in FIG. 2B, the blocking material having a refractive index of 3.180 provides a fundamental transverse mode. This represents a refractive index difference between the active and blocking regions of 0.023. $In_{0.95}Ga_{0.05}As_{0.12}P_{0.88}$ is an example of a material having this refractive index. The bandgap energy for the material is 1.267 eV with a corresponding wavelength of 0.979 μm. The bandgap energy is only 0.083 eV smaller than that of InP, and thus, should not degrade the blocking characteristics of the p-n junctions.

Figure 3:
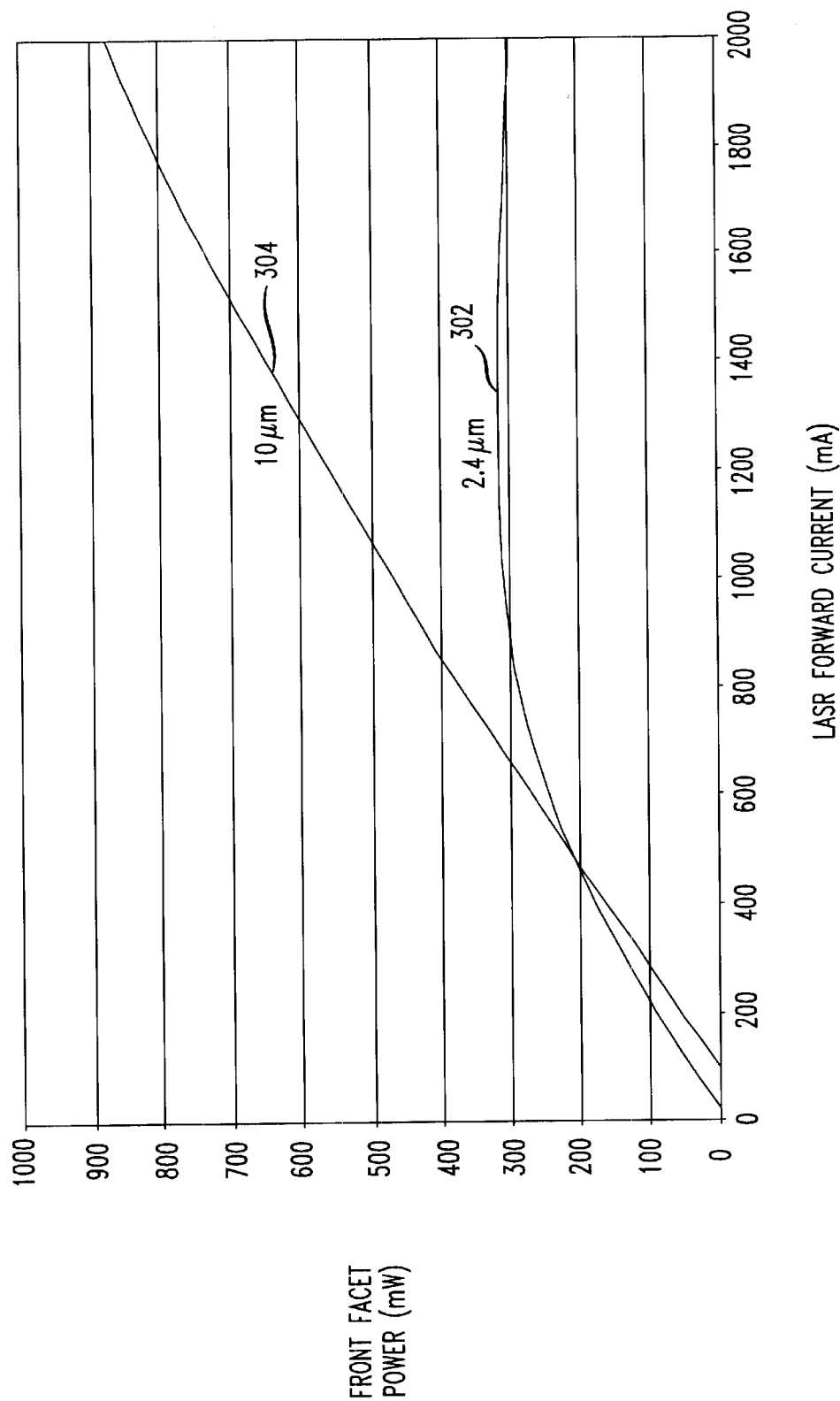
FIG. 3 shows the light-current curves for an exemplary 2.4 μm and 10 μm waveguide.

Single-mode rate equations were used to simulate light-current (LI) characteristics of the larger stripe width obtained with the InGaAsP material having a 3.180 refractive index. The LI curve of a conventional high performance 1480 nm pump laser was modeled. For a waveguide width of 2.4 μm the simulated internal power loss is 12.5 cm$^{-1}$ and the confinement factor is 5.87%. For a series resistance of 2 ohms, a spreading thermal impedance of 20° C./W, and a temperature dependent loss of 0.5 cm$^{-1}$/° C., the threshold current is 26 mA, the front facet power at 600 mA is 241 mW, and the roll-over current is 1200 mA, for a chip length of 1 mm. For a laser with the larger, 10 μm waveguide width a simulation was performed using an internal loss of 11.7 cm$^{-1}$ and a confinement factor of 6.18%. Because the series resistance and the spreading thermal impedance are inversely proportional to the waveguide width, it was determined that the larger waveguide series resistance was 0.48 ohms and the larger waveguide width spreading thermal impedance was 4.8° C./W. The calculated threshold current was 103 mA and the front facet power at 600 mA was 266 mW, and at 160 mA the front facet power was 729 mW. FIG. 3 shows the LI curves 302 and 304 for the 2.4 μm waveguide width and the 10 μm waveguide width, respectively.

Figure 4A:
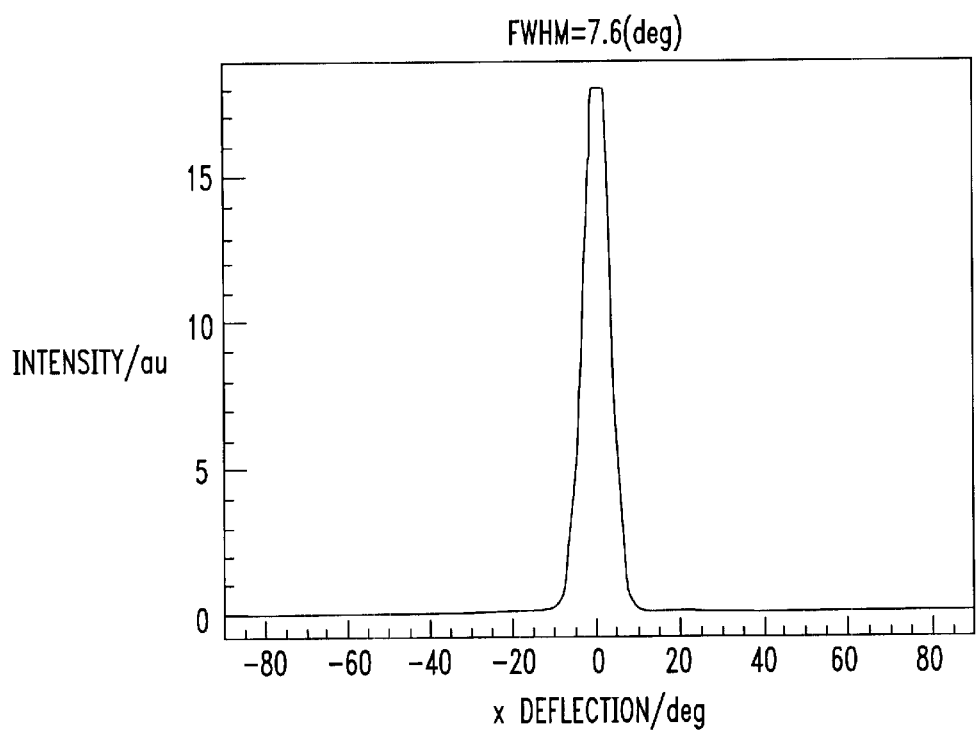
FIGS. 4A–4B depict horizontal and vertical far-field patterns of an exemplary 10 μm width waveguide laser.
Figure 4B:
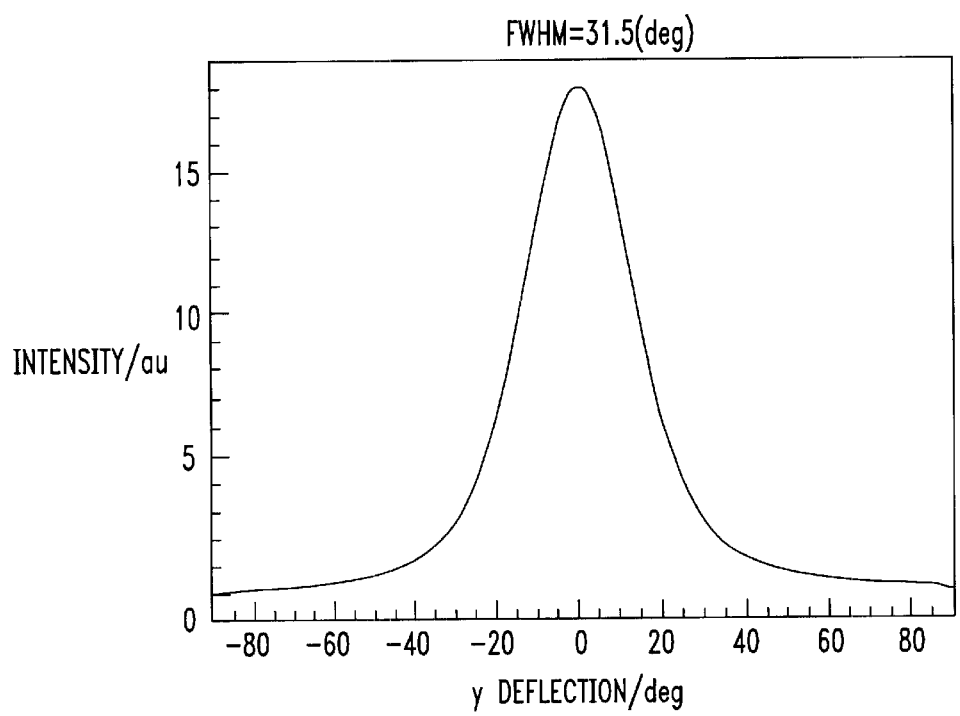

A simulation was also produced for both horizontal (x) and vertical (y) far-field patterns of the 10 μm width waveguide laser. These patterns are depicted in FIGS. 4A–B, respectively. The horizontal full-width-half-maximum (FWHM) far-field angle was 7.6 degrees and the vertical angle was 31.5 degrees. Advantageously, this beam pattern is ideal for coupling to a cylindrical fiber lens and may provide a coupling efficiency of greater than 80%. Accordingly, a fiber coupled power of greater than 500 mW may be realized at 1500 mA. Furthermore, the thermal power dissipation may be 1.74 W at a laser driving current of 1500 mA, making it possible to package the device with a standard 14 pin butterfly enclosure.

The simulations provided a basis for a design of the semiconductor pump laser having an active region material and a blocking region material wherein the refractive index difference between the two materials at the fundamental frequency is less than about 0.029 and wherein the laser has a single transverse mode. An exemplary refractive index difference range for the semiconductor laser is about 0.020 to 0.025. It is desirable that the index of refraction of the active region material is greater than the refractive index of the blocking region material. In one embodiment of the invention the blocking region material is $In_{0.95}Ga_{0.05}As_{0.12}P_{0.88}$. More generally the blocking material may, for example, comprise $In_{1-x}Ga_xAs_yP_{1-y}$ wherein x is less than about 0.96 and y is less than about 0.90. In another embodiment of the invention the active region material is GaAs and the blocking region material is InGaAsP. The composition of InGaAsP may be chosen to obtain the desired refractive index difference between the active and blocking regions.

The active region width of the laser may be greater than about 2.4 μm with exemplary ranges of about 3.0 μm to 15 μm, and about 8.5 μm to 10.5 μm. In a particular embodiment the laser has a refractive index difference between the active and blocking regions of about 0.020 to 0.025 and an active region width in the range of about 8.5 μm to 10.5 μm.

Embodiments of the invention provide a front facet power greater than or equal to about 500 mW with an illustrative range of 500 mW to 900 mW. A particular embodiment of the invention provides a laser with an active region having a width in the range of about 8 μm to 11 μm and having a front facet power in the range of about 700 mW to 800 mW.

The single mode transmission power of the laser is greater than about 300 mW, with an exemplary range of about 300 mW to about 550 mW.

In one embodiment of the laser, blocking regions comprise a stack of at least one n-InGaAsP, p-InGaAsP pair, wherein an n-InGaAsP layer is adjacent to a p-electrode and a p-InGaAsP layer is adjacent to an n-electrode. The blocking regions may also be constructed with a semi-insulating layer. An illustrative example includes a semi-insulating layer between a p-InP layer and an n-InP layer.

The refractive index differences described above may achieve confinement factors of greater than about 6.0%, with an illustrative range of about 6% to 7%.

Embodiments of the invention may be applied to lasers of any wavelength but present technology will likely encourage use with lasers having wavelengths of 1480 nm and 980 nm for example.

Blocking capability generally increases as the blocking material bandgap energy increases. According to embodiments of the invention the blocking material may have, for example, a bandgap energy greater than 1.20 eV, with an illustrative range of about 1.20 eV to 1.40 eV.

Semiconductor laser 100 is fabricated by first providing substrate 106 which has an illustrative thickness in the range of about 50 μm to 150 μm with an exemplary thickness of 100 μm. Active region 102 and blocking regions 104 are disposed on substrate 106 and have a refractive index difference of less than about 0.029. In one embodiment of the invention the desired refractive index difference is achieved by forming the active and blocking regions of like-materials. Active region 102 may have, for example, a thickness in the range of about 0.041 μm to 0.06 μcm, and is disposed between blocking regions 104. Top layer 108 is disposed on blocking regions 104 and active region 102, and may have, for example, a thickness in the range of about 2 μm to 4 μm with an illustrative thickness of about 3 μm. Blocking regions 104 comprise a plurality of layers which may have thicknesses in a range of about 0.5 μm to 1.5 μm, with a demonstrative thickness of 1.0 μm. Electrodes (not shown) are provided above top layer 108 and below substrate 106 and may have thicknesses in the range of about 3.5 μm to 4.5 μm.

Embodiments of the invention provide an active area having a high coupling efficiency to an optical fiber as compared to conventional lasers. For example, the coupling efficiency to a single mode fiber may be greater than about 75%.

Embodiments of the invention are particularly applicable to fiber amplifiers, for example, erbium doped fiber amplifiers and Raman fiber amplifiers.

The laser of the present invention may be fabricated by any conventional method by which active and blocking regions may be formed wherein their refractive index difference at the fundamental frequency is less than about 0.029. Provided below as an example is a fabrication method for a mesa buried heterostructure distributed feedback laser which may be used to construct a laser according to embodiments of the present invention.

A double heterostructure is grown over conventional first-order distributed feedback gratings that are etched into a substrate. The substrate may be, for example, InP. The double heterostructure may be grown by a variety of epitaxial techniques such as for example, liquid phase epitaxy, hybrid vapor phase epitaxy, and metalorganic vapor phase epitaxy. The double heterostructure may consist of a plurality of layers. An oxide layer, such as silicon dioxide for example, is deposited over the surface of the double heterostructure. Stripes are photolithographically patterned in a direction perpendicular to the gratings. The silicon dioxide, or analogous layer, serves as both an etch mask during mesa etching and a growth mask during blocking layer growth which is performed using metalorganic vapor phase epitaxy. Mesas are chemically etched to the desired width, for example, 1.0–3.0 μm. The mesas that are formed are vertical walled for several microns below the surface, thus providing good correspondence between the mesa width and the active width. After etching, semi-insulating blocking layers are regrown around the mesas by selective metalorganic vapor phase epitaxy.

After metalorganic vapor phase epitaxy blocking layer regrowth, the $SiO_2$ is etched away in HF, and hybrid vapor phase epitaxy is used to provide additional thickness to the double heterostructure. The wafers are processed using conventional n- and p- contacts. The wafers are thinned and the laser chips cleaved and bonded to copper or ceramic sinks. Asymmetric high reflectivity anti-reflection mirror coatings are applied to the facets by electron beam evaporation to stabilize the single-longitudinal mode. The anti-reflection coating consists of amorphous zirconia with 10% yttria and the asymmetric high reflectivity coating is yttria which is overcoated with silicon.

The exemplary embodiments having been described in detail, many variations and modifications will become apparent to those skilled in the art. For example, structural variations or material modifications that provide or allow for refractive index differences of less than about 0.029, and a single transverse mode with a power of greater than about 300 mw are within the spirit and scope of the invention. Accordingly, it is intended that the invention not be limited to the specific illustrative embodiments but be interpreted within the full spirit and scope of the appended claims.

What is claimed is:

1. A method of fabricating a semiconductor laser comprising:
   providing an active region having a first material having a first refractive index;
   providing blocking regions having a second material having a second refractive index, the blocking regions comprising one or more layers, and the blocking regions being adjacent to and extending laterally from opposite sides of the active region;
   wherein a refractive index difference between the first material and the second material at a fundamental frequency of the laser is less than about 0.029;
   wherein the laser has a single transverse mode; and
   wherein the first and second materials are like-materials.

2. The method of claim 1 wherein the refractive index difference is in the range of about 0.020 to 0.025.

3. The method of claim 1 wherein the first material and the second material are InGaAsP and the first material refractive index is greater than the second material refractive index.

4. The method of claim 1 wherein the second material is $In_{0.95}Ga_{0.05}As_{0.12}P_{0.88}$.

5. The method of claim 1 wherein the active region has a width greater than about 2.4 μm.

6. The method of claim 1 wherein the active region has a width in the range of about 3.0 μm to 15 μm.

7. The method of claim 1 wherein the active region width is in the range of about 8.5 μm to 10.5 μm.

8. The method of claim 1 wherein the semiconductor laser has a front facet power, and the front facet power is greater than or equal to about 500 mW.

9. The method of claim 8 wherein the front facet power is in the range of about 500 mW to 900 mW.

10. The method of claim 8 wherein the active region has a width in the range of about 8 μm to 11 μm and the front facet power is in the range of about 700 mW to 800 mW.

11. The method of claim 1 wherein the laser has a single mode transmission power greater than about 300 mW.

12. The method of claim 1 wherein the laser has a single mode transmission power in the range of about 300 mW to about 550 mW.

13. The method of claim 1 further comprising providing a stack of at least one n-InGaAsP, p-InGaAsP pair to form the blocking regions, and wherein an n-InGaAsP layer is adjacent to a p-electrode and a p-InGaAsP layer is adjacent to an n-electrode.

14. The method of claim 13 wherein the blocking regions comprises a semi-insulating layer.

15. The method of claim 1 wherein the active and blocking regions comprise like-materials and the ratio of elements in the active region material differs from the ratio of elements in the blocking region.

16. A method of fabricating a semiconductor laser:
   providing an active region having a first material;
   providing blocking regions having a second material comprising one or more layers, the blocking regions adjacent to and extending laterally from opposite sides of the active regions;
   wherein the refractive index difference between the first material and the second material at a fundamental frequency of the laser is less than about 0.029;
   wherein the laser has a single transverse mode; and
   wherein the second material is $In_{0.95}Ga_{0.05}As_{0.12}P_{0.88}$.

* * * * *